United States Patent [19]

King

[11] 4,296,378

[45] Oct. 20, 1981

[54] APPARATUS PROVIDING ENHANCED DETECTION OF SPECIMENS IN INHOMOGENEOUS FIELDS

[75] Inventor: James D. King, San Antonio, Tex.

[73] Assignee: Southwest Research Institute, San Antonio, Tex.

[21] Appl. No.: 27,302

[22] Filed: Apr. 5, 1979

[51] Int. Cl.³ .......................................... G01N 27/00
[52] U.S. Cl. .................................. 324/313; 324/316
[58] Field of Search ........................ 324/307, 313, 316

[56] References Cited

U.S. PATENT DOCUMENTS

| | | | |
|---|---|---|---|
| 3,714,551 | 1/1973 | Pajak | 324/313 |
| 4,110,681 | 8/1978 | Hofer | 324/313 |

OTHER PUBLICATIONS

Digitized Magnetic-Field Sweeper for ESR Spectrometer, Takehiko Hidaka, The Review of Scientific Instruments, vol. 44, No. 1, Jan. 1973, pp. 79, 80.

*Primary Examiner*—Michael J. Tokar
*Attorney, Agent, or Firm*—Gunn, Lee & Jackson

[57] ABSTRACT

This disclosure is directed to improved equipment in detection of desired nuclei or electron response. In a magnetic field thought to be inhomogeneous, an improvement which incorporates means for summing repetitive samples is disclosed. Excitation is applied to the sample of interest, and the received signal is broken into samples over the life of the received signal and temporarily stored. The flux is varied by varying the magnet current, and several nuclear magnetic resonance signals are received. They are similarly sampled periodically and added to earlier responses. They are preferably stored in a buffer after conversion by an analog-to-digital convertor. After stepping through several magnetic levels, the testing is completed. The summation of the various signals is a signal enhancement technique which overcomes the lack of a uniform optimum field impressed on the sample of interest.

18 Claims, 5 Drawing Figures

APPARATUS PROVIDING ENHANCED DETECTION OF SPECIMENS IN INHOMOGENEOUS FIELDS

BACKGROUND OF THE DISCLOSURE

In the detection of various compounds through nuclear magnetic resonance (NMR) or electron spin resonance (ESR), one beginning condition is the imposition of a fairly uniform magnetic field at a specified flux level on the specimen of interest. In the laboratory, field shape and uniformity can be fairly easily controlled. There is an optimum which is achieved in the laboratory and difficult to achieve in the field. For instance, in the laboratory, the specimen is typically controlled in quantity (more than enough to provide a response) which quantity is located in an ampule or container of relatively small shape. This may not necessarily occur in the field; that is to say, the application of the present apparatus for detection of buried land mines, parcel bombs, letter bombs, bombs secreted in luggage intended for aircraft and the like may utilize a dispersed explosive. Dispersal of the explosive may place part of it outside the optimum and uniform magnetic field.

In laboratory conditions, it is possible to obtain a magnet system having poles which are appropriately shaped and positioned to form a uniform field. Again, practical applications may not be so kind. As an example, the present invention finds application in the inspection of mail parcels for bombs. To inspect packages, it may be necessary that the magnets be placed along a common face or plane of the package and are prevented from bracketing the package inasmuch as the package may be larger than the spacing between the magnetic poles. Positioning of the magnetic poles at the opposite ends of a specimen assists in providing a uniform field, particularly when the magnetic poles have a cross-sectional area which is relatively large in comparison with the specimen. The opposite may occur in a given situation where the poles are relatively small, located to the side of a specimen and dwarfed by the relative dimensions of the specimen so that the specimen, while being in a magnetic field, is certainly not in a uniform magnetic field or a field maintained at the optimum field intensity.

NMR and ESR techniques often require fairly tight control of field intensity. The field intensity must achieve some calculated optimum value to obtain the necessary resonance of interest. The present invention overcomes this handicap. As an example, it has been discovered that a field of 800.00 Gauss detects level crossing in the explosive RDX. The RDX may be concentrated or in an inert plastic dilutant; it is not critical to the operation of the NMR detection apparatus. The 800.0 Gauss value permits limited variation over a relatively narrow range. The phenomena of interest results from the interaction of the magnetic field resonance and an excitation signal from transmitter. The field strength and frequency of the transmitter are rigorously related. Accordingly, the margin for field variations is quite narrow and is not a broad band phenomena. Moreover, excessive flux density is equally a problem with deficient flux density.

One important factor in obtaining a good reading is that a time perturbation process occurs. Each interrogation or stimulation of the specimen at the requisite frequency of interrogation and magnetic flux density perturbs the specimen so that subsequent retesting requires a long wait; the length of time to permit the disturbance to subside is quite long and can vary widely with different compounds. This depends in large part on the makeup of the specimen, itself. The present invention provides repeated interrogations, but, as to a given nucleus in a specimen, the field inhomogeneities do not impact that nucleus unless and until the critical flux level range is achieved.

It is possible to provide a fixed frequency, variable magnetic flux NMR system. The reverse is also possible. The provision of field equipment suitable for testing of large volumes of letters, packages or luggage utilizes a U-shaped magnet which is typically inadequate in size and geometric configuration to provide a uniform field over the specimen. The specimen, itself, may be relatively small, sufficient to fill a few cubic centimeters. However, it may be located within a larger suitcase which is hundreds, perhaps thousands of times larger in volume. With this constraint in mind and in testing for typical explosives such as RDX or TNT, the spread of the magnetic field is about 2.0 to 50.0 Gauss for a range of samples and magnetic field strengths.

Again, referring to a commercial installation as opposed to laboratory equipment, it may be appropriate to position the magnet near a fixed locus of items to be inspected such as luggage. One alternative is to move the sample relative to the magnet. Another alternative is to move the magnet relative to the sample. In both cases, the net result is a variation in flux intensity which is a function of time and sample geometry. Ideally, the field should pass through the specimen of interest and the surrounding accoutrements so that the entire item of interest is swept by magnetic flux at the selected or optimum value. While certain sample portions may be swept by nonoptimum parts of the optimum magnet field (strength at an incorrect field intensity for excitation), it is possible to sum several sweeps of the specimen. This is particularly helpful in enhancing the signal-to-noise ratio (S/N) in that the coherent signal (from the optimum field portion) adds in a manner to reinforce, while the incoherent noise (from any source) is not additive in the same manner. Accordingly, while a given specimen of interest is stored within a large package or suitcase, the entirety of the package or suitcase can be swept and all responses summed coherently to provide an output signal which encodes the NMR response to the nuclei of interest.

This will apply whether the magnet forms a field with a small gradient or a high gradient. Indeed, it overcomes the drawback which occurs with high gradient fields, namely, where the NMR response is so small as a result of reduced effective sample volume that the signal of interest has heretofore been submerged in the noise. The signal-to-noise ratio limits available data interpretation techniques. Accordingly, the present invention provides signal summation via a digitizing and buffering approach which occurs prior to the detection process. Signal summation occurs within the circuit after the signal has been amplified, but not before it has been detected. Accordingly, it is working with the amplified but undetected RF signal. Positioning of the summation circuit ahead of nonlinear detection circuitry is, therefore, advantageous because it enhances the summed signal prior to detection.

SUMMARY OF THE PRESENT DISCLOSURE

This disclosure is an NMR system which is enhanced to overcome difficulties with magnetic field homogeneity and difficulties arising from magnetic pole geometry or configuration. The present invention contemplates the application of a spatially nonuniform magnetic field to a specimen where the specimen is swept by varying the field. As an example, the field might be stepped through five levels of intensity. The field is increased by steps to assure that at one step or another all possible portions of the specimen are exposed to a desired field intensity. While a different field intensity is created on each occasion, stimulation of the various portions of the specimen inevitably occur during the range of the sweep. During sweeping, certain portions of the specimen may be exposed to the incorrect field intensity; no particular problem arises from this. At each sweep step, a timed response is obtained from the specimen, and all such responses can be readily summed. Responses are, therefore, received, digitized, momentarily stored, added in a reinforcing manner and thereafter reconverted from digital form to analog form to comprise the output signal.

DETAILED DESCRIPTION OF THE ILLUSTRATED EMBODIMENT

Figure 1:
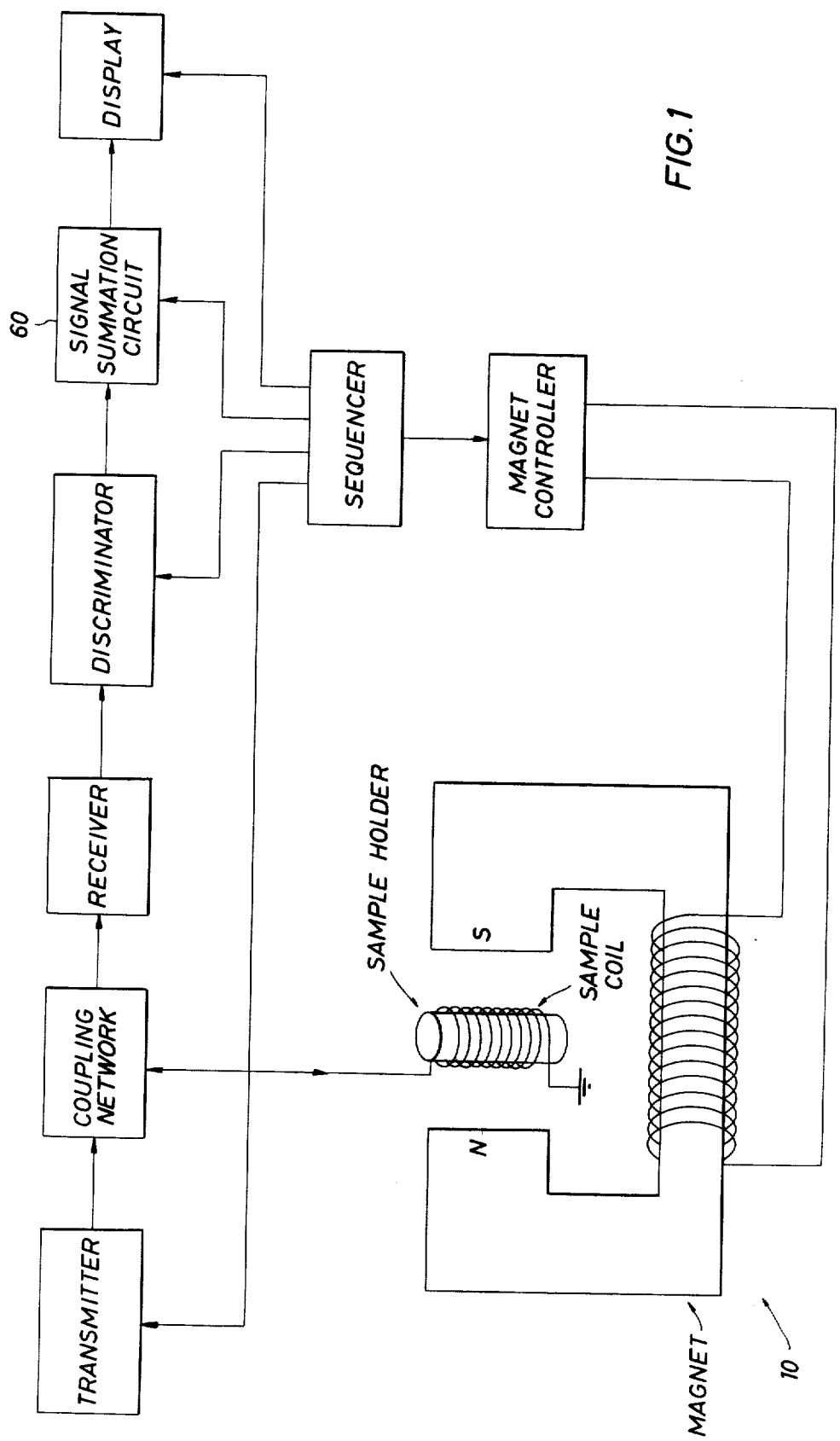
FIG. 1 is a schematic block diagram of an NMR detection apparatus.

Attention is first directed to FIG. 1 of the drawings where an NMR testing apparatus 10 is disclosed. This is apparatus of the same sort found in U.S. Pat. application Ser. No. 839,519, filed Oct. 5, 1977, and assigned to a common assignee hereof. Rather than detail all of the components shown in FIG. 1, they function in substantially the same manner as disclosed in the mentioned co-pending patent application. Moreover, the present invention is an improvement over that disclosure as will be described.

Figure 3:
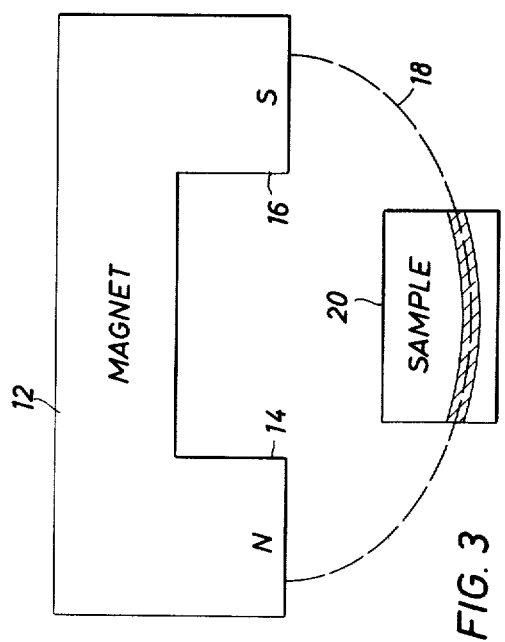
FIG. 3 is a simplified view of a magnet coacting with a specimen or sample showing how the magnetic lines of flux impinge on the specimen.

Attention is momentarily directed to FIG. 3 of the drawings where a magnet 12 having a first pole 14 arranged opposite a second pole 16 forms a magnetic field. The field includes a flux line 18 which impinges on a sample or specimen 20. Other flux lines can be drawn. For purposes of describing FIG. 3, all other flux lines will be omitted. Flux lines are, of course, an arbitrary mode of representing phenomena within the field, itself. For this description, the flux line 18 is assumed to be the correct intensity level to obtain interaction with the specimen for interrogation by the NMR equipment 10 shown in FIG. 1. It is further assumed that additional flux lines occur in FIG. 3. The other flux lines, whether passing through the sample 20 with excessive flux density or reduced flux density, impinge on the sample 20 and interact with the sample in the known manner. However, because they are not the required flux intensity, they do not yield the desired output. This is because the frequency and the flux level are related in a unique fashion, which relationship is relatively narrow in field variation.

It will be appreciated that a change of the current level applied to the magnet 12 will change the location of the flux line 18. Such a change will shift the zone or portion of the sample 20 interrogated by the equipment. FIG. 3 depicts a portion of the sample undergoing interrogation. Quite clearly, some other portion can also be interrogated on changing the strength of the magnet. The application of three or four changes in current level to the magnet results in the formation of the optimum flux level 18 at different portions of the sample so that all portions of the sample are eventually interrogated. By relating the size of the sample, magnet current, number of steps and other scale factors, it is possible to sweep the entire structure of the sample in a few steps. Perhaps six or eight steps at the most will be required for most samples.

Figure 4:
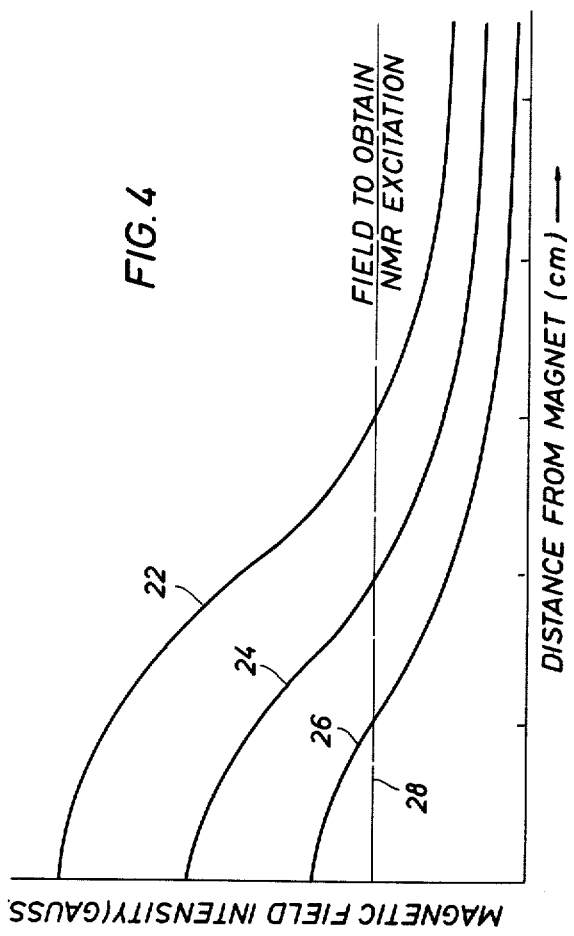
FIG. 4 shows the relationship of magnetic field intensity and distance from the magnet for several steps of field intensity.

The foregoing is illustrated in FIG. 4 where magnetic field intensity for three separate currents is charted. The three current levels form three different curves identified at 22, 24 and 26. The field necessary to obtain NMR excitation is marked on FIG. 4 by the straight line 28. The value 28 is the norm or requisite level to obtain NMR excitation. The range of deviation where excitation will occur has not been indicated. It is a relatively narrow phenomena with a relatively narrow margin for variation. In any case, the excitation applied to the specimen must have a field intensity of approximately the level indicated in FIG. 4. Because the intensity in a particular portion of the specimen is variable with distance, such variations, in fact, vary the response intensity of the specimen and, outside the field 18, prevent excitation of the nuclei of interest.

Figure 5:
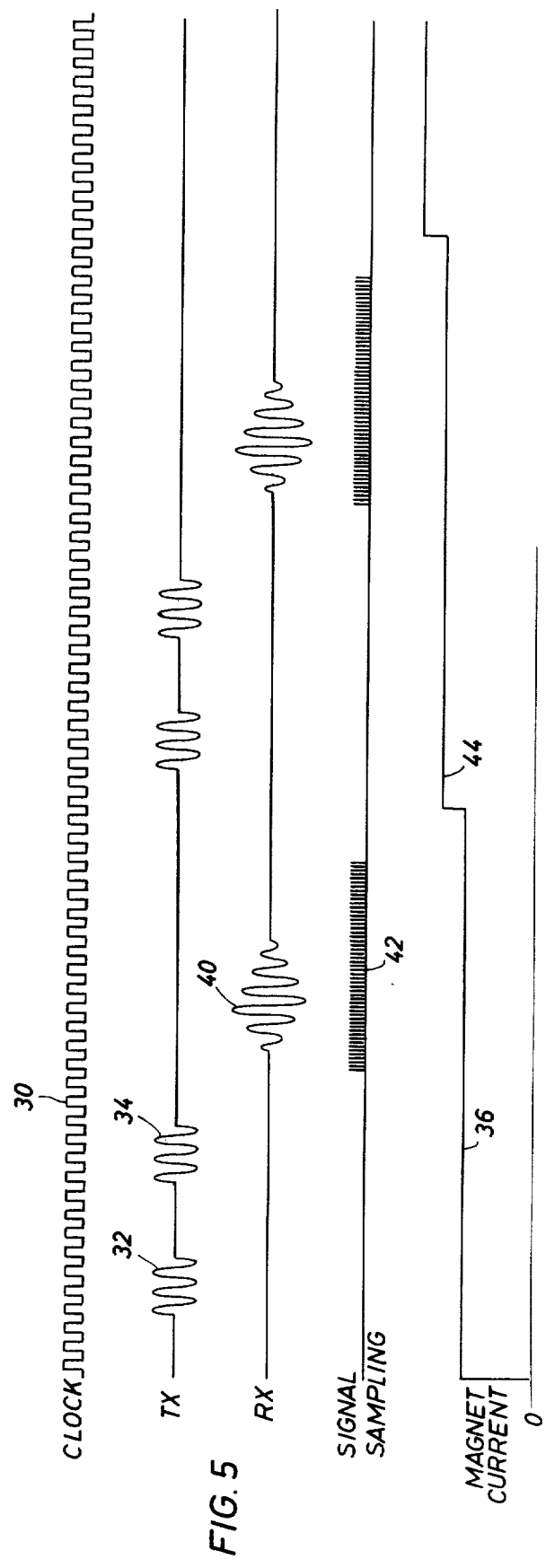
FIG. 5 is a timing chart which assists in understanding how the apparatus of the present invention operates.

Attention is next directed to FIG. 5 of the drawings which is a timing chart useful in understanding this invention. The improvement taught herein initiates operation with a clock pulse which is identified by the numeral 30. It forms a transmitted RF pulse of an appropriate frequency. A good frequency for working with hydrogen and nitrogen is 2.30 megacycles. A first burst 32 and a second burst 34 are formed and transmitted into the sample. The pulses 32 and 34 occur while a particular magnetic field is maintained in the sample. As an example, it might correspond to the magnetic flux formed by the current level 26 shown in FIG. 4. To this end, the numeral 36 identifies a magnetic current level which has some suitable scale relative to zero. The current applied to the magnet forms a first field which may be quite homogeneous or overwhelmed by severe gradients. However, the current 36 is selected so that some portion usually, less than one hundred percent, of the sample volume is in flux of the optimum level to obtain NMR excitation. This optimum level is identified by the line 28 in FIG. 4. Other parts of the sample will not usually be in the optimum part of the field.

The doublet pulse triggered by the transmitter for the specimen creates an output signal 40 which is present provided the nuclei of interest is in the volume of the sample illuminated by the proper or optimum field strength. The output pulse 40 is on the trace identifying the output signal of the receiver. In the timing chart of FIG. 5, the pulse 40 is shown with an idealized noise level which, in actuality, may be much larger. The noise level can be quite large, but it is characterized in that it is always incoherent. The transmitted pulses and received pulse are typically RF signals having frequencies which vary with the materials.

The pulse 40 occurs at a certain timed interval after the two transmitted pulses 32 and 34. The time elapsed between the transmitted pulses and the received pulse 40 is reasonably well known for selected nuclei. Because it is well known, a sampling process is initiated slightly in advance of the received pulse 40. The received pulse 40 is thus sampled over a number of timed intervals. As an example, the period or time base of the clock pulse 30 is selected in advance. In the preferred embodiment, it is desirable to define from the clock a window of time indicated by the numeral 42 which window occurs at a specific time interval after the transmitted pulses 32 and 34, and the window, itself, is divided into a specified number of time increments. The increments are all equal and are preferably sufficiently small that each cycle of the pulse 40 (2.30 megacycles in the one embodiment) is sampled several times, such as eight times or more. It has been discovered that an ideal sampling rate is 2,048 samples occurring at a rate of approximately 100.0 megahertz. The sample times are positioned equally in the window 42 and occur at a sufficient frequency to obtain a fairly definitive signal input from the receiver.

FIG. 5 shows a change in current identified by the step in magnet current at 44. This is timed by the clock signal 30. The transmitter pulses are, again, triggered and formed. On this operation, the two transmitted pulses occur at a time suitably separated from the next pair of transmitted pulses, permitting the magnetic field to settle to the designated value. Again, the entire cycle of operation is repeated, except it occurs with a stepped up magnet current level.

As will be observed, a received pulse again occurs, and it, too, is sampled at the same specific rate. The same window of time is repeated, beginning at a point in time synchronized with the transmitted pulses. The received signal is thus broken down into a number of individual signals which are, themselves, subsequently digitized.

The present invention scans the sample by repeatedly changing the magnet current. As the current is changed, the location of optimum field intensity is changed. Some other portion of the sample will then be scanned with the proper or optimum field intensity. Some other portion of the field will then be irradiated by the transmitted pulse, and a received pulse will then be formed from that portion. If the sample varies in quantity of the nuclei of interest, of course, the output signal may be decreased or increased as the case may be. In any event, the current is stepped from some low value to some high value (or in the reverse direction) so that all parts of the sample volume are prospectively tested. That is to say, the various parts of the volume of the sample are interrogated by passing flux of the optimum density through that part. Each operation forms its own receiver signal, and these signals, although in analog form in FIG. 5, are converted into digital words, stored in a buffer and later summed for reinforcement of one another. This is understood by reference to the other drawings of this disclosure.

Figure 2:
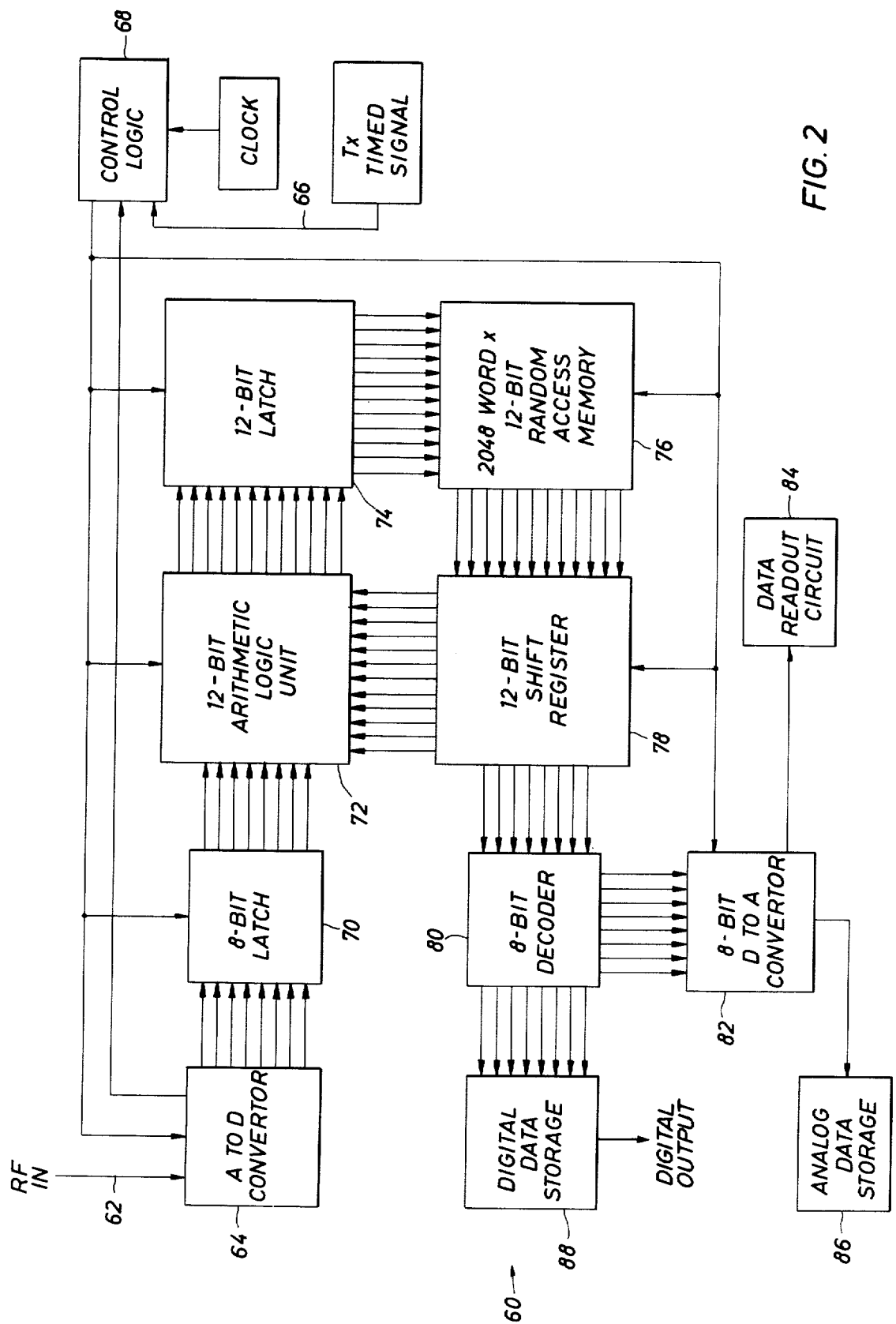
FIG. 2 is a schematic block diagram of a portion of the circuitry shown in FIG. 1.

Attention is next directed to FIG. 2 of the drawings and apparatus identified generally by the numeral 60. It is the signal summation circuit shown in FIG. 1 of the drawings. In the main, it operates on the receiver signal which is input on the conductor 62. The conductor 62 is input to a high speed analog-to-digital convertor 64 which runs extremely fast, typically in the range of 100.0 megacycles, and forms an output digital word on each operation. Preferably, the word has about eight bits of definition with a sign bit.

The numeral 66 identifies an input line providing the transmitter timed signal which is delivered to a control circuit 68. The control circuit 68 initiates operation of the other components and is connected to the analog-to-digital convertor 64 and triggers it into operation. Its operation is timed by the clock signal 30 which is generated by a clock in the control logic 68.

In the preferred embodiment, the convertor 64 forms 2,048 encoded digital words which occur at an evenly timed spacing and represent digitized values of the received signal. Under the assumption the received signal is formed of a coherent NMR response and incoherent noise superimposed on the response of interest, the instantaneous signal is encoded and converted into a digital word. The word is output to an eight-bit latch 70 and is momentarily held there. It is then transferred on a timed command signal from the control logic 68 to a twelve-bit arithmetic logic unit (ALU) 72 where it is summed. The ALU 72 is an additive circuit. A first word is provided to it, a second word subsequently occurs, and the two are added by the ALU. The word input from the latch 70 represents the digitized instantaneous value of the received signal. It is added to a previous word having a value of up to twelve bits which was derived by the addition of all previous words occurring at that timed interval during the sample time 42. Thus, each sample time 42 is encoded into a specified number of digital words, ideally, 2,048 words per window. All the words derived from a given window are maintained separate from one another. They are added to similar words from another window. When the equipment forms the first interrogation of a given received signal, a first window time 42 occurs, and 2,048 digital words are formed. As shown in FIG. 5, the magnetic field intensity is changed, and a second set of 2,048 words is formed. The second set is added to the first set. A third set is subsequently formed, and it is summed with the first and second sets. While all of this summing is completed, there are still 2,048 words. However, they do not represent the measured values of a single received pulse. Rather, they represent the summation of the samples obtained from N individual window times, where N is a whole number integer and represents the number of received pulses or window times derived from a given specimen. M is a whole number integer representative of the number of samples in a window 42.

Following on a selected word in the window time 42, assume that a particular word from the latch 70 is added to a prior total in the ALU 72. The arithmetic is completed, and a new word is formed. Upon completion of the new sum at the ALU 72, it is then transferred to a twelve-bit latch 74. This buffers the signal for a moment. The buffered signal is then input into a random access memory (RAM) 76 which holds words of the designated length and, in this example, words of twelve bits in length. It stores or holds M number of words necessary to encode the entire window time 42 or, in the preferred embodiment, 2,048 words. These are scale factors and can be varied over some range. Ideally, the sampling rate should exceed about eight samples per cycle of the received signal. The words which are added together achieve coherent reinforcement of the signals. The number of words is equal to the number of different field intensities formed by the magnet in the sample so that the entirety of the sample is swept. If desired, the sample can be swept completely more than once. As an example, the sample can be swept twice. By obtaining more data and, therefore, summing more received signals, the signal is enhanced to improve the signal-to-noise ratio.

The RAM 76 has the temporary, partially complete M sums for each window time stored therein. If, for instance, fifty (N=50) received pulses are to be digitized and stored, the RAM will store temporary data for forty-nine operations. On the fiftieth operation, it will store the final data (M words). To this end, it is connected to a twelve-bit shift register 78 which has two outputs, one being to the ALU 72. This enables the partial sums (less than N) to travel from the latch 70 (a single word representative of a single value) through the ALU 72, into the RAM 76 and back to the ALU 72 where each word is added in to a maximum of M. Since this occurs for M data points, the operation is continued in cyclical fashion until M data words have been summed for N times.

At the conclusion of testing of a particular sample, the RAM 76 will then hold M words which are, themselves, obtained from N summations. At this juncture, the shift register 78 is connected to a partial decoder circuit 80. The least significant bits are omitted. The decoder 80 thus forms an output signal which is then delivered to a digital-to-analog convertor 82. The circuit 82 converts the M digital words back to an analog value. The analog signal is delivered to a data readout circuit 84 which is, in turn, connected to the data display previously mentioned. Alternatively, the output of the convertor 82 is supplied to an analog data storage device 86. A digital data storage device 88 with a digital output is also connected to the decoder 80.

As explained to this juncture the present invention interrogates a particular sample or specimen by stepping the magnet current. The number of steps is represented by the numeral N. Each window time is broken up into N equally spaced sample times. Because computers are organized with memory addresses in multiples of two, it is ideal to use a power of two, or, in this case, 2,048 sample times for M.

The present invention is particularly helpful in obtaining data with a high degree of resolution. Through the use of 2,048 individual samples (each summed where eight-bit words for up to sixteen words providing a twelve-bit sum), extremely high quality data is yielded. It will be recognized that the signal-to-noise ratio is enhanced because the totallized output signal adds directly where coherent, but, as to the noise, the addition is the square root of the sum of the squares of the noise. This clearly improves the signal-to-noise ratio. At the time of readout, an analog readout can be obtained.

In the preferred embodiment, utilizing an interrogation signal of about 2.30 megacycles and further using a sampling rate of about 100.0 megacycles, forty-three samples per cycle of signal are taken. This provides extremely sharp definition. Dropping the ratio by five to about 8.70 samples per cycle, suitable data can still be obtained. At lower sampling rates, there is the risk that a superimposed beat pattern may occur.

The reconstructed analog output provided at the data readout circuit 84 is representative of the sample of interest, and, in particular, it provides a quantified representation of the nuclei of interest. This is particularly helpful in determining the presence or absence of the explosive materials as occur in letter bombs, suitcases, packages and the like. This helps regulate and control the use of hidden bombs in terrorist activities.

Many scale factors have been given in this disclosure. Needless to say, they can be altered or varied depending on need or circumstances. The present invention is also useful for detecting nonexplosive materials. As noted in the referenced parent disclosure, the present invention can be used quite nicely in detection of explosives or in detection of compounds of medical interest.

While the foregoing is directed to the preferred embodiment, the scope of the present invention is determined by the claims which follow.

I claim:

1. Improvements in a nuclear magnetic or electron spin resonance detection apparatus which tests a sample for the presence and quantity of nuclei of interest which apparatus forms a magnetic field on the sample and wherein a magnetic field intensity of a specified value coacts with a transmitted RF pulse of a specified shape and frequency in the sample, which apparatus includes
   (a) a magnet control means;
   (b) an electromagnet operated by said control means;
   (c) a pulsed RF transmitter operable to form an RF pulse of a specified pulse shape and frequency;
   (d) a receiver positioned to receive an RF signal from the sample as a result of the transmitted RF pulse;
   wherein the improvement comprises:
   (1) first means for selectively operating the magnet control means to form different magnetic field strengths acting on the sample to expose multiple incremental portions of the sample to a magnetic field intensity within specified limits;
   (2) timing means for controllably operating the transmitter to form repetitively transmitted pulses for the sample which pulses are transmitted into the sample synchronized with the operation of said first means; and
   (3) summing means connected to the receiver for summing repetitively formed received signals from the sample, said summing means summing the received signals after synchronization thereof relative to the relative occurrence of the transmitted RF signals.

2. The apparatus of claim 1
   (a) wherein said first means operates said magnet control means to form a certain field strength for a specified interval and thereafter operates to form another field strength for a specified interval wherein the field strengths form fields within specified limits in incremental portions of the sample;
   (b) wherein each field strength irradiates the sample to expose a part, but less than the whole, of the sample to a specified field strength; and
   (c) wherein other parts of the sample are irradiated to something other than the optimum field strength.

3. The apparatus of claim 2
   (a) wherein the magnet control means forms different current levels to form different magnetic field intensities;
   (b) wherein said timing means times operation of the RF transmitter to transmit in timed relationship to changes in current level;
   (c) wherein said timing means times operation of the summing means to sum a received signal from the receiver for each level of current; and
   (d) wherein each received signal is added to previously received signals.

4. The apparatus of claim 1 wherein said summing means includes
   (a) analog-to-digital convertor means connected to the receiver;
   (b) memory means having capacity to store M words connected to said convertor means to receive M words therefrom, where M is a whole number integer;
   (c) said timing means initiating operation of said convertor means to form M timed conversions of the received signal at a specified time after the transmitter is operated;
   (d) said timing means further initiating operation of said convertor means N times, where N is a whole number integer, and said timing means times operation of said first means to form different field intensities from the electromagnet on the sample;
   (e) adder means for adding each of the M words formed N times by said convertor means in assigned partial sums up to N-1 summations, where each of the M words is added only to its respective words occurring in sequence up to N words to form M words, where each word is a digital representation of the summed values; and
   (f) output means connected to receive M words after said adder means forms the words, said adder means forming a signal representative of the response of the nuclei of interest in the sample.

5. The apparatus of claim 4
   (a) wherein said adder means inputs the words to said memory means at up to M locations therein;
   (b) including means for interrogating said memory means in synchronization with the formation of the M words in digitizing data by said convertor means to bring from memory the synchronously required words for addition by said adder means; and
   (c) further wherein said adder means is connected to said memory means to return the partially completed sum representative of less than N signals from the sample.

6. The apparatus of claim 5 wherein said timing means forms a control signal for each of the N operations of the transmitter and each operation thereof initiates formation of M evenly spaced timing signals supplied to said convertor means to control its operation.

7. The apparatus of claim 1
   (a) wherein the sample is interacted with the RF and magnetic fields acting thereon and forms an RF response to a specified frequency;
   (b) wherein the received signal is output by the receiver;
   (c) including analog-to-digital convertor means converting the received RF signal to a multibit word encoding the value and sign thereof;
   (d) said convertor means connecting to a buffer means which consecutively stores M words as formed by said convertor means; and
   (e) further including a digital data storage device supplied with M words from said buffer means.

8. The apparatus of claim 4 wherein said adder means has two inputs, one of said inputs being connected to the output of a buffer means which is connected to the output of said convertor means and the second input being connected to storage register means which is connected to the output of said memory means.

9. The apparatus of claim 8 including connections forming a closed loop from said adder means into a buffer means which is output to said memory means which is output to said storage register means.

10. The apparatus of claim 9 wherein a word of M words in memory is circulated along said closed loop and is incrementally summed with a new word from said convertor means on receipt of a signal for each of N received signals.

11. The apparatus of claim 10 wherein said output means comprising digital-to-analog convertor means is connected to data output means.

12. The improved method of testing a sample of interest for nuclear magnetic or electron spin resonance
   (a) wherein the sample is irradiated by a magnetic field having a portion of the field within an optimum range of field strengths;
   (b) wherein some portion of the field is outside the range of optimum field strength;
   (c) further wherein the sample is interrogated by transmitting an RF pulse of a specified shape and frequency into the sample;
   the improved method comprising the steps of:
   (1) repetitively, for at least two steps, altering magnetic field intensity on the sample so that at least a differing portion of the sample is within a field of optimum field strength where the portion in the field is varied dependent on altered magnetic field intensity;
   (2) transmitting an RF pulse into the sample at a frequency related to the optimum field intensity and nuclei of interest, where the pulse has a pulse shape and duration of a specified form;
   (3) receiving a signal from the sample as a result of the transmitted pulse;
   (4) wherein the step of transmitting is repeated for at least each level of magnetic field intensity;
   (5) wherein the step of receiving is repeated for each transmitted pulse; and
   (6) summing in a summing means the received signals which received signals are summed in a timed fashion on reference to the transmitted pulses.

13. The method of claim 12 wherein said summing step includes the steps of
   (a) digitizing at equal timed intervals the received signal to form a series of M digital words;
   (b) digitizing the next received signal at the same timed intervals to form a second series of M digital words; and
   (c) summing the two series of M words which summing combines words of the two series occurring at time correspondent locations in the series of digital words wherein the summation of series of digital words sums received signals from the sample to sweep the sample.

14. The method of claim 13 further including the steps of
   (a) temporarily storing in a memory means a series of M digital words;
   (b) thereafter forming a second series of M digital words which represents a received signal;
   (c) adding the second series to the stored series of words in an adder means and forming a sum comprised of M words which is input into the memory means to be stored therein subsequent to removal of the digital words previously stored therein; and
   (d) repeating these steps for subsequently occurring received signals to form partial sums until the last received signal is received and digitized, and the sum formed thereafter is the final sum.

15. The method of claim 14 where N received signals are digitized and N series of M digital words are summed to form the final sum of M words.

16. The method of claim 12 wherein the step of altering the magnetic field intensity is achieved by moving the sample relative to the magnet which forms the magnetic field.

17. The improved method of testing a sample of interest for nuclear magnetic or electron spin resonance
  (a) wherein the sample is irradiated by a magnetic field having a portion of the field within an optimum range of field strength;
  (b) wherein some portion of the field is outside the range of optimum field strength;
  (c) further wherein the sample is interrogated by transmitting an RF pulse of a specified shape and frequency into the sample;
  the improved method comprising the steps of:
  (1) repetitively, for at least two steps, transmitting an RF pulse into the sample at a varied frequency, where the pulse has a pulse shape and duration of a specified form;
  (2) imposing a magnetic field of specified strength on the sample;
  (3) receiving a signal from the sample as a result of the transmitted pulse;
  (4) wherein the step of transmitting is repeated for at least each frequency;
  (5) wherein the step of receiving is repeated for each transmitted pulse; and
  (6) summing in a summing means the received signals which received signals are summed in a timed fashion on reference to the transmitted pulses.

18. The method of claim 17 wherein the magnetic field strength is zero.

* * * * *